United States Patent
Luo et al.

(10) Patent No.: US 8,887,011 B2
(45) Date of Patent: Nov. 11, 2014

(54) ERASED PAGE CONFIRMATION IN MULTILEVEL MEMORY

(71) Applicant: SanDisk Technologies Inc., Plano, TX (US)

(72) Inventors: Ting Luo, Sunnyvale, CA (US); Jianmin Huang, San Carlos, CA (US); Chris Nga Yee Avila, Saratoga, CA (US); Dana Lee, Saratoga, CA (US); Gautam Ashok Dusija, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 75 days.

(21) Appl. No.: 13/784,693

(22) Filed: Mar. 4, 2013

(65) Prior Publication Data

US 2014/0075252 A1    Mar. 13, 2014

Related U.S. Application Data (60) Provisional application No. 61/700,794, filed on Sep. 13, 2012.

(51) Int. Cl.
| | |
|---|---|
| *G11C 29/00* | (2006.01) |
| *G06F 11/00* | (2006.01) |
| *G11C 29/50* | (2006.01) |
| *G06F 11/10* | (2006.01) |
| *G11C 11/56* | (2006.01) |
| *G11C 16/34* | (2006.01) |
| *G11C 29/42* | (2006.01) |

(52) U.S. Cl.
CPC ...... *G11C 29/50004* (2013.01); *G06F 11/1072* (2013.01); *G11C 11/5635* (2013.01); *G11C 16/344* (2013.01); *G11C 29/42* (2013.01)
USPC .......................................... 714/721; 714/745

(58) Field of Classification Search
USPC ......... 714/718, 721, 745, 746, 752, 763, 769, 714/770, 773, 799, 800, 6.1, 6.24, 48, 52; 365/200, 201, 218, 185.09, 185.29, 365/185.3, 185.33; 711/100, 115
See application file for complete search history.

(56) References Cited

U.S. PATENT DOCUMENTS

| | | |
|---|---|---|
| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,661,053 A | 8/1997 | Yuan |
| 5,768,192 A | 6/1998 | Eitan |
| 5,903,495 A | 5/1999 | Takeuchi et al. |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

*Primary Examiner* — Christine Tu
(74) *Attorney, Agent, or Firm* — Davis Wright Tremaine LLP (57) ABSTRACT

In a multi-level cell memory array, a flag that indicates that a logical page is unwritten is subject to a two-step verification. In a first verification step, the logical page is read, and ECC decoding is applied. If the first verification step indicates that the logical page is unwritten, then a second verification step counts the number of cells that are not in an unwritten condition.

15 Claims, 11 Drawing Sheets

(56) References Cited

U.S. PATENT DOCUMENTS

| | | |
|---|---|---|
| 6,011,725 A | 1/2000 | Eitan |
| 6,046,935 A | 4/2000 | Takeuchi et al. |
| 6,222,762 B1 | 4/2001 | Guterman et al. |
| 7,304,893 B1 * | 12/2007 | Hemink ............... 365/185.22 |
| 8,484,533 B2 * | 7/2013 | Olbrich et al. ............... 714/763 |
| 2006/0171210 A1 * | 8/2006 | Nagashima et al. ...... 365/189.01 |
| 2012/0220088 A1 | 8/2012 | Alsmeier |
| 2012/0243328 A1 * | 9/2012 | Tatebe et al. ............ 365/185.22 |

* cited by examiner

Programming into four states represented by a 2-bit code

Multistate Memory

FIG. 7A

Lower Page Programming (2-bit Code)

FIG. 7B

Upper Page Programming (2-bit Code)

FIG. 7C

Lower Page Read (2-bit Code)

FIG. 7D

Upper Page Read (2-bit Code)

FIG. 12

ERASED PAGE CONFIRMATION IN MULTILEVEL MEMORY

BACKGROUND

This application relates to the operation of re-programmable non-volatile memory systems such as semiconductor flash memory that can store one or more bits per cell by writing multiple states, and more specifically, to verifying that memory cells that are identified as being in a particular condition, such as erased or programmed to only certain memory states, are truly in the condition indicated.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

In order to improve read and program performance, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page are read or programmed together.

In one common arrangement, individual cells may use two or more memory states to store one or more bits of data. Initially, a page of memory cells may be programmed with a "lower page" of data consisting of one bit per cell. Later programming may add an "upper page" of data in the same cells by writing an additional bit in each cell. More than two bits may also be successively stored in this way in some memory systems. At any given time, a memory may include physical pages with different program levels, some physical pages containing zero bits per cell, some with one bit per cell, and some with two or more bits per cell. When programming such memories it is important to know how many bits per cell a particular page contains.

One way to know how many bits are stored in a particular page is to use a separate flag or indicator associated with the page.

SUMMARY OF THE INVENTION

Where flags are used to indicate whether a logical page is written, or unwritten, such flags may not always be reliable so that verification may be performed to ensure that memory cells are truly unwritten (erased) prior to attempting to program the cells. A first verification step may read the logical page and use Error Correction Code (ECC) analysis of the data to verify that a flag is correct. In some cases, even ECC may not be sufficient to adequately ensure that memory cells are unwritten. A second verification step may count the number of cells that are in a state that does not correspond to the cells being unwritten (i.e. states corresponding to some programming of data in the cells). This number can be compared with a threshold number and the memory cells may be considered unwritten only if this number is less than the threshold.

An example of a method of verifying a program/erase condition of a logical page of a multilevel flash memory includes: reading one or more flag bits that indicate the program/erase condition of the logical page; in response to determining that the one or more flag bits indicate that the logical page is erased, further verifying the erased condition of the logical page by: performing a read of the logical page; performing Error Correction Coding (ECC) analysis of data read from the logical page; subsequently identifying a number of cells that are not in a state corresponding to the logical page being erased; comparing the number of cells that are not in a state corresponding to the logical page being erased with a predetermined number in order to verify the program/erase condition of the logical page.

The logical page may be an upper page and the read of the logical page may be performed using two read voltages. Subsequent to performing the ECC analysis, a subsequent read may be performed. The number of cells that are not in a state corresponding to the logical page being erased may be identified from the subsequent read. The subsequent read may be performed using one of the two read voltages. The subsequent read may be performed using a voltage that is different to both of the two read voltages. ECC analysis of data read from the logical page may indicate a pass result.

An example of a method of verifying that a logical page in a multi-level cell (MLC) flash memory is unwritten includes: in response to determining that a flag indicates that the logical page is unwritten, subsequently performing a read operation on the logical page to obtain verification data; subsequently performing Error Correction Code (ECC) analysis of the verification data; if the verification data passes ECC analysis then identifying the logical page as written; if the verification data fails ECC analysis then determining a number of bits in the logical page that are inconsistent with the logical page being unwritten; comparing the number with a threshold; if the number exceeds the threshold then identifying the logical page as written; and if the number does not exceed the threshold then identifying the logical page as unwritten.

The logical page may be a lower page and the number of bits in the logical page that are inconsistent with the logical page being unwritten may be obtained from the verification data. The number of bits in the logical page that are inconsistent with the logical page being unwritten may be obtained from an additional read operation that is performed subsequent to performing the ECC analysis of the verification data. The logical page may be an upper page and the additional read operation may identify memory cells in a memory state with the highest threshold voltage range. When the logical page is identified as written, subsequent writing to the logical page may be prohibited until after an erase is performed.

An example of a multi-level cell (MLC) flash memory system includes: an array of flash memory cells arranged in physical pages, each physical page having capacity to store two logical pages of data, a lower page and an upper page; a plurality of page status flags, each page status flag associated with a logical page; a read circuit configured to read data from the memory array; an Error Correction Code (ECC) circuit configured to encode data to be stored in the array of flash memory cells and decode data from the array of flash memory cells, the ECC circuit configured to identify errors in data from the array; and a page verification circuit configured to verify a page status flag that indicates that a logical page is unwritten by obtaining an indication from the ECC circuit that the logical page is unwritten, and subsequently determining a number of bits within the logical page that are not in an unwritten state, and verifying the logical page as unwritten only if the number is less than a threshold number.

The read circuit may apply a set of read conditions to determine the number of bits within the logical page that are not in an unwritten state. The set of read conditions may include a discrimination voltage to discriminate between written and unwritten cells.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION

DETAILED DESCRIPTION

Memory System

Figure 1:
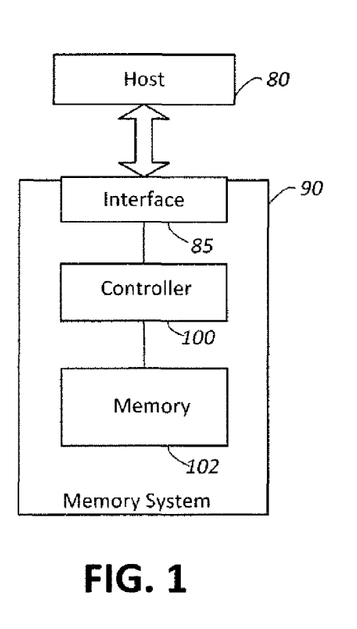
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits, a processor, ROM (read-only-memory), RAM (random access memory), programmable nonvolatile memory, and additional components. The controller is typically formed as an ASIC (application specific integrated circuit) and the components included in such an ASIC generally depend on the particular application.

Physical Memory Structure

Figure 2:
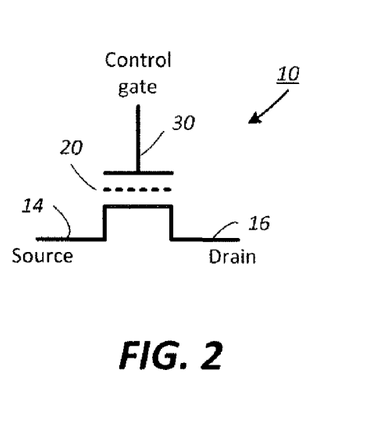
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and U.S. Pat. No. 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
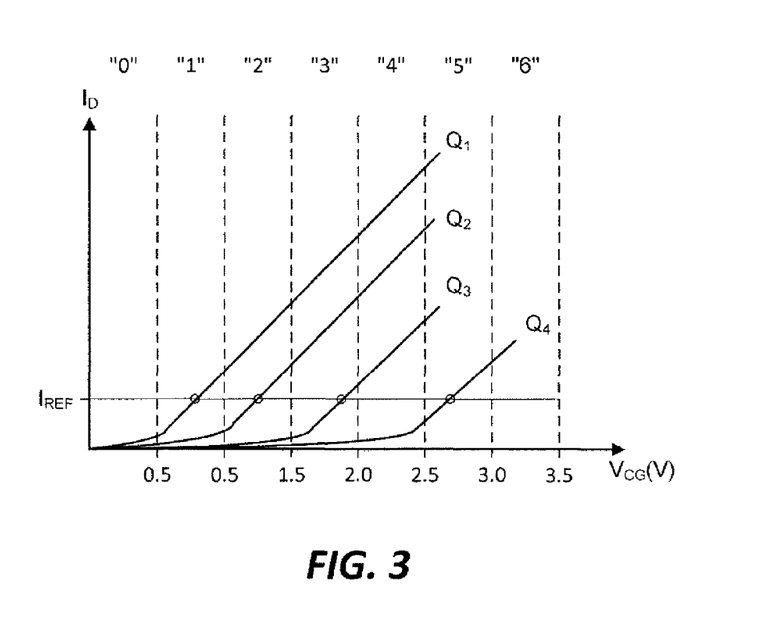
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four possible charge levels that can be programmed on a floating gate of a memory cell, respectively corresponding to four of eight possible memory states (programmed states 0-6 plus the erased state). As an example, the threshold voltage window of a population of cells may range from 0.5V to 3.5V. Seven programmed memory states "0", "1", "2", "3", "4", "5", "6", and one erased state (not shown) may be demarcated by partitioning the threshold window into regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
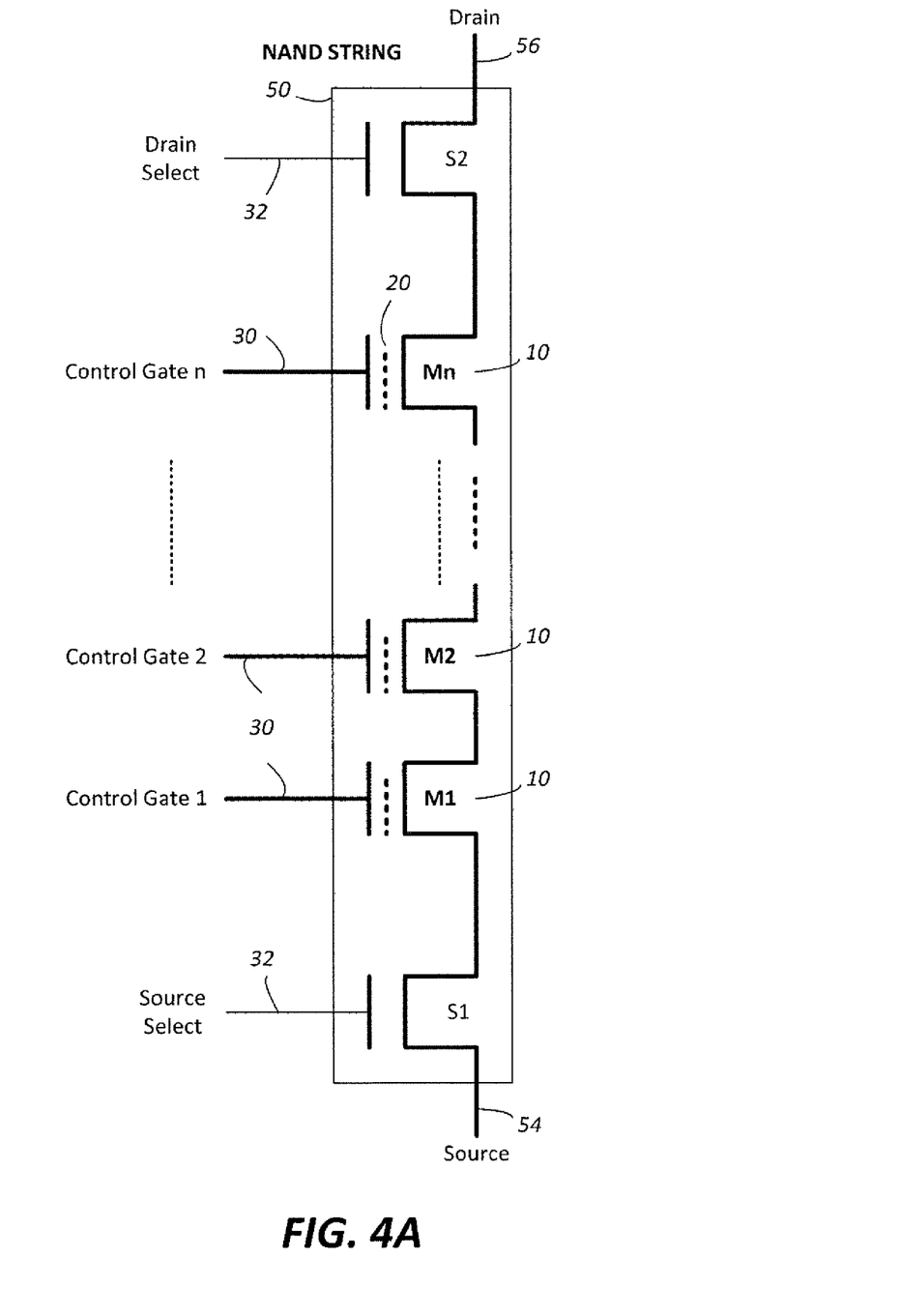
FIG. 4A illustrates schematically a string of memory cells organized into a NAND string.

FIG. 4A illustrates schematically a string of memory cells organized into a NAND string, A NAND string 50 comprises of a series of memory transistors M1, M2, ... Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 4B:
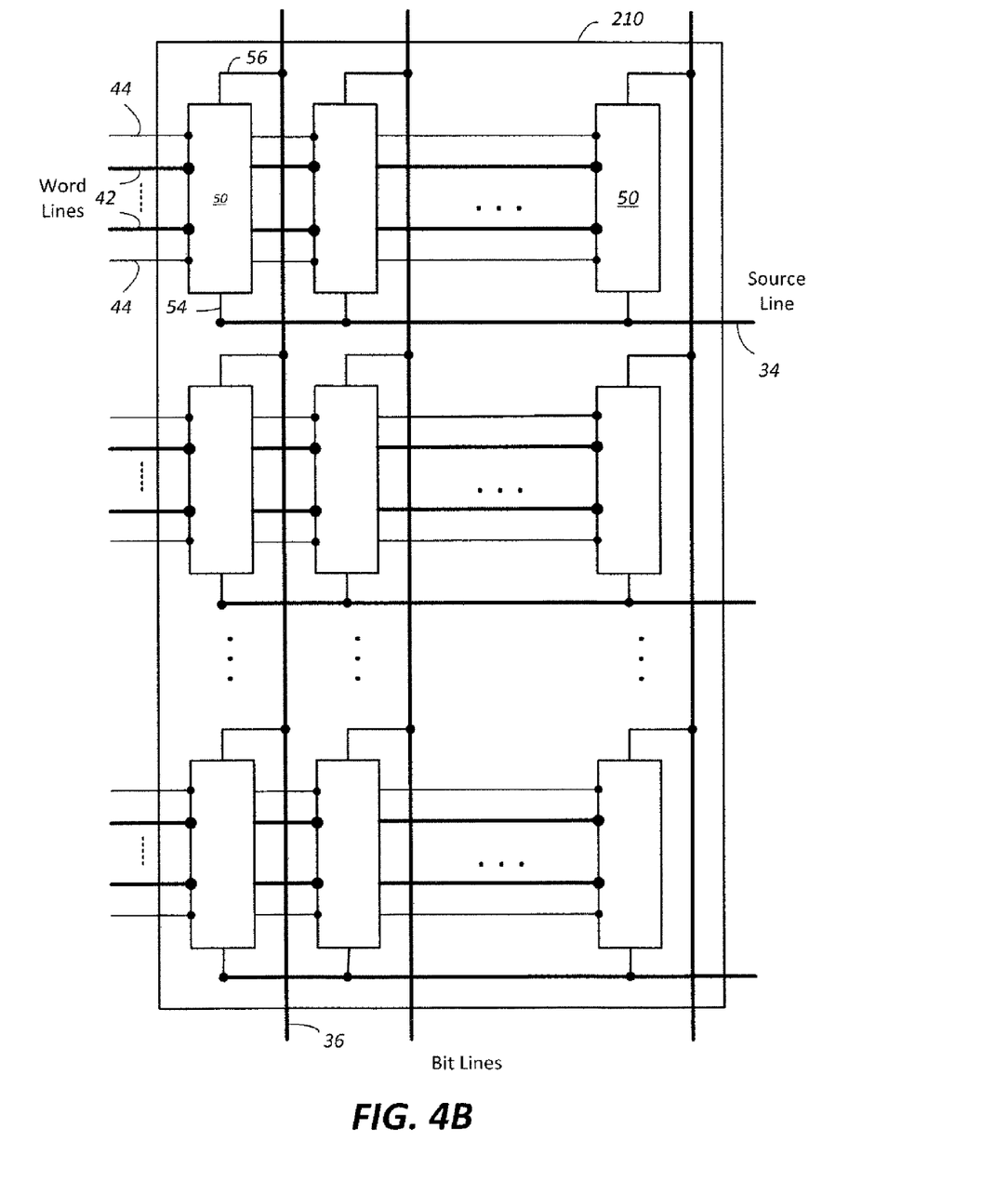
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
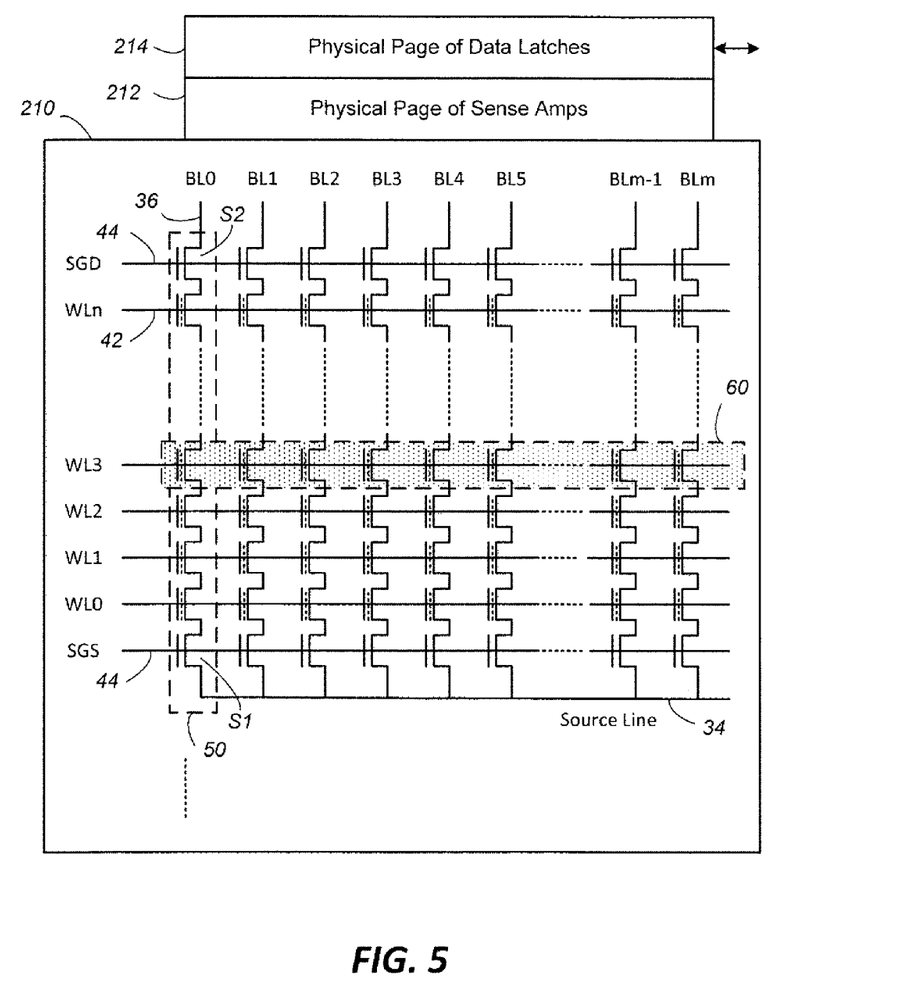
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One important difference between flash memory and other of types of memory is that a cell must be programmed from the erased state. That is the floating gate must first be emptied of charge. Programming then adds a desired amount of charge back to the floating gate. It does not support removing a portion of the charge from the floating gate to go from a more programmed state to a lesser one. This means that update data cannot overwrite existing one and must be written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell, one physical page stores one logical page of data. In memories that store two bits per cell, a physical page stores two logical pages. The number of logical pages stored in a physical page thus reflects the number of bits stored per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending up from the wafer surface. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings. Examples of such NAND strings and their formation are described in U.S. Patent Publication Number 2012/0220088.

All-Bit, Full-Sequence MLC Programming

Figure 6A:
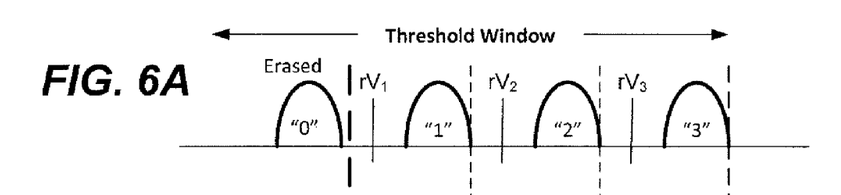
FIGS. 6A-6C illustrate an example of programming a population of 4-state memory cells.
Figure 6B:
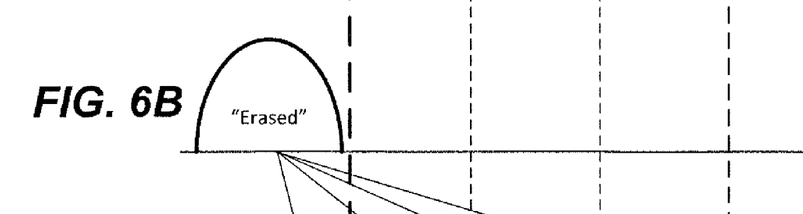
Figure 6C:
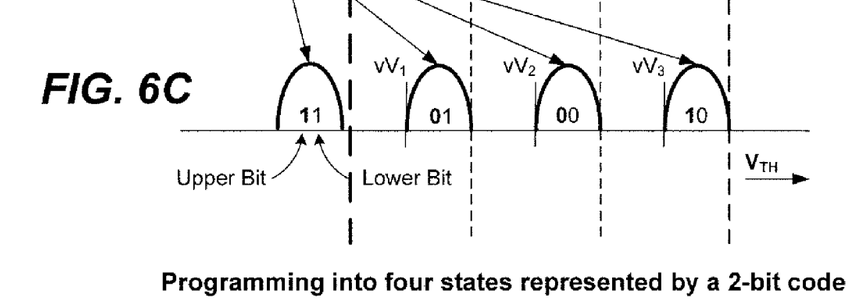

FIGS. 6A-6C illustrate an example of programming a population of 4-state memory cells. FIG. 6A illustrates the population of memory cells programmable into four distinct distributions of threshold voltages respectively representing memory states "0", "1", "2" and "3". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In $vV_2$. In this way, each memory cell can be programmed to one of the three programmed states "1", "2" and "3" or remain un-programmed in the "erased" state, As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

Bit-by-Bit MLC Programming and Reading

Figure 7A:
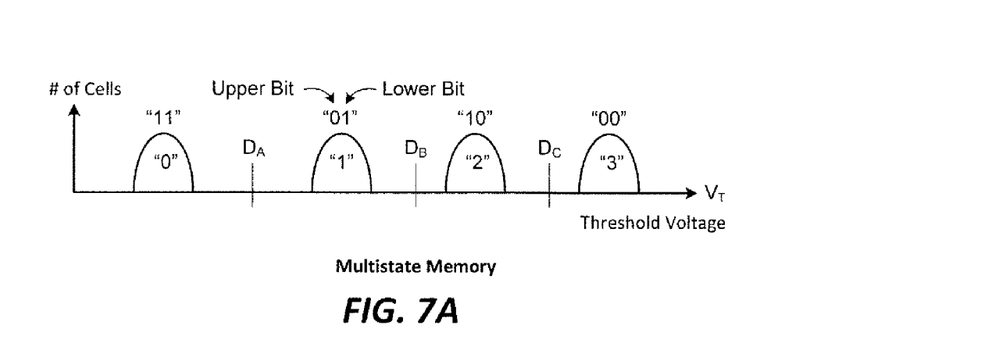
FIGS. 7A-7E illustrates an example of the programming and reading of the 4-state memory encoded with a given 2-bit code.

FIGS. 7A-7E illustrate the programming and reading of the 4-state memory encoded with a given 2-bit code. FIG. 7A illustrates threshold voltage distributions of the 4-state memory array when each memory cell stores two bits of data using the 2-bit code. Such a 2-bit code has been disclosed in U.S. Pat. No. 7,057,939.

Figure 7B:
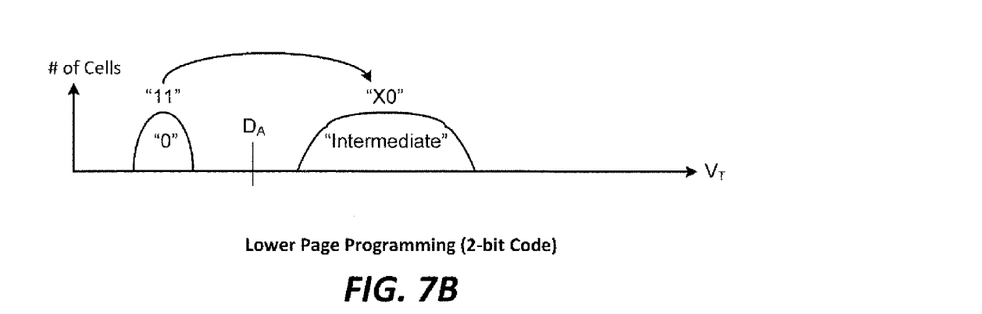

FIG. 7B illustrates the lower page programming (lower bit) in a 2-pass programming scheme using the 2-bit code. The fault-tolerant LM New code essentially avoids any upper page programming to transit through any intermediate states. Thus, the first pass lower page programming has the logical state (upper bit, lower bit)=(1, 1) transits to some intermediate state (x, 0) as represented by programming the "unprogrammed" memory state "0" to the "intermediate" state designated by (x, 0) with a programmed threshold voltage greater than $D_A$ but less than $D_C$.

Figure 7C:
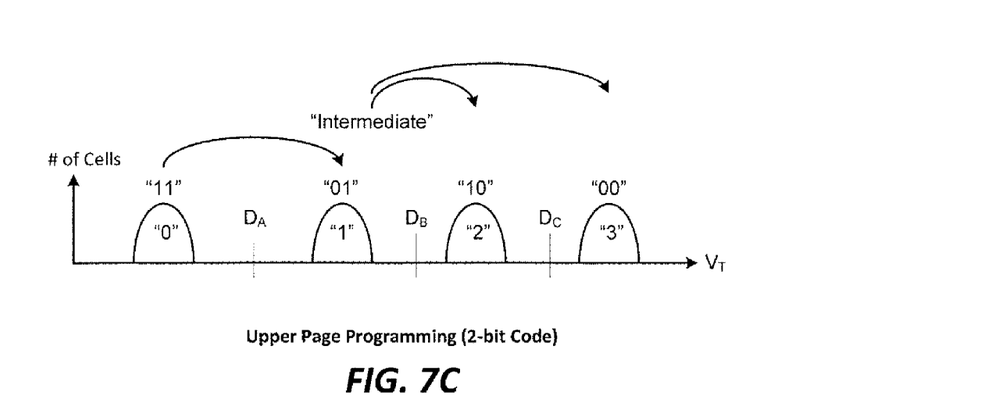

FIG. 7C illustrates the upper page programming (upper bit) in the 2-pass programming scheme using the 2-bit code. In the second pass of programming the upper page bit to "0", if the lower page bit is at "1", the logical state (1, 1) transits to (0, 1) as represented by programming the "unprogrammed" memory state "0" to "1". If the lower page bit is at "0", the logical state (0, 0) is obtained by programming from the "intermediate" state to "3". Similarly, if the upper page is to remain at "1", while the lower page has been programmed to "0", it will require a transition from the "intermediate" state to (1, 0) as represented by programming the "intermediate" state to "2".

Figure 7D:
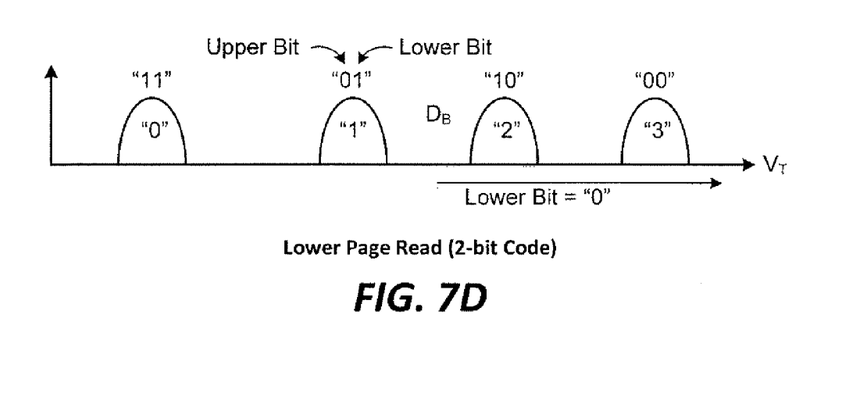

FIG. 7D illustrates the read operation that is required to discern the lower bit of the 4-state memory encoded with the 2-bit code. If the upper page has been programmed and then a readB operation will yield the lower page data correctly. On the other hand, if the upper page has not yet been programmed, the lower page data should be read by a readA operation.

Figure 7E:
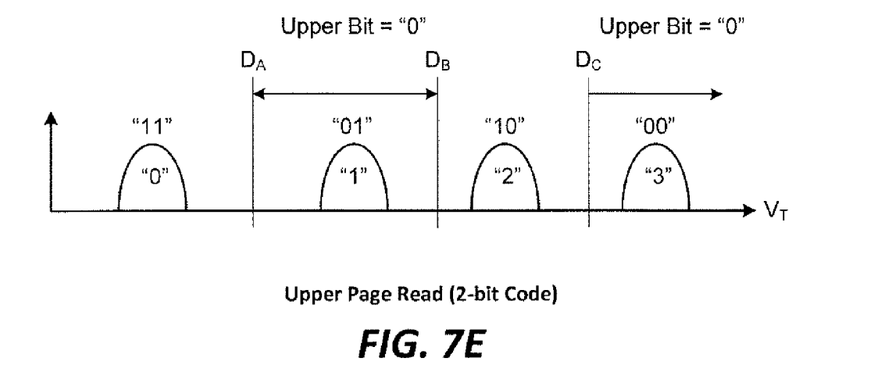

FIG. 7E illustrates the read operation that is required to discern the upper bit of the 4-state memory encoded with the 2-bit code. As is clear from the figure, the upper page read will require a 3-pass read of readA, readB and readC, respectively relative to the demarcation threshold voltages $D_A$, $D_B$ and $D_C$.

In the bit-by-bit scheme for a 2-bit memory, a physical page of memory cells will store two logical data pages, a lower data page corresponding to the lower bit and an upper data page corresponding to the upper bit. In other examples, additional pages of data may be stored by storing more than two bits per cell in a physical page.

In many situations, a flash memory will contain physical pages having a mix of programmed levels. Some pages may remain empty with all cells in an erased condition. Some may store one bit per cell (lower page), and are ready to store more data. Some may store two bits per cell (upper page). In many memories this is the most data that is written in a cell. However, in other memories three or more bits may be stored in a cell so that even with two bits per cell there is still capacity for additional data. The capacity remaining in any given physical page depends on the total number of memory states used in the memory system, and the number of states already programmed (i.e. how many bits have already been written per cell). In yet other examples, the number of bits per memory cell may not be an integer (e.g. three states per cell), or some encoding scheme may be used so that a bit of data may be stored over more than one cell. It will be understood that while the present examples refer to determining the number of bits stored per cell, in general it is the number of written states that is determined (and in many cases the number of bits is determined from the number of states). The present embodiments are not limited to any particular mapping of bits to memory states and can be used to determine the number of memory states written regardless of their mapping to particular bits.

In order to know whether additional data can be written in a physical page it is necessary to know if there is data already written in the page, and if so—how much. For example, in a two bit per cell scheme, a physical page of memory cells may have remaining capacity that is sufficient to store two logical pages if it is unwritten, or remaining capacity sufficient to store just one logical page if it already contains one logical page. Any error in determining the amount of data already stored in a physical page can have significant consequences. For example, if a physical page is identified as full when it is not full, this may result in never filling the page so that space is wasted. More importantly, if a physical page is identified as having some additional capacity that it does not have, this may result in writing new data into memory states that are already programmed with previously written data. This can result in the loss of both the previous data and the new data because the resulting memory states may not reflect either of these sets of data. Thus, it is important that the correct programming level of a page be properly identified (e.g. lower page, or lower and upper page).

It is also important to know what programming levels are programmed in order to correctly read data from a physical page. For example, reading lower page data may require different read voltages depending on whether the corresponding upper page of the same physical page is programmed (written) or erased (unwritten). FIG. 7B shows a situation where the lower page is programmed and the upper page is erased. The lower page data can be read using a read voltage corresponding to $D_A$ in this case (readA). FIG. 7D shows the situation where both lower and upper pages have been programmed. In this case, reading the lower page data requires using a read voltage corresponding to $D_B$ that is different to $D_A$ (readB, not readA). Using the wrong read voltages in either case could cause incorrect data to be read. For example, trying to read the data of FIG. 7B using readB conditions, or trying to read the data of FIG. 7D using readA conditions would not provide the correct lower page data.

Figure 8:
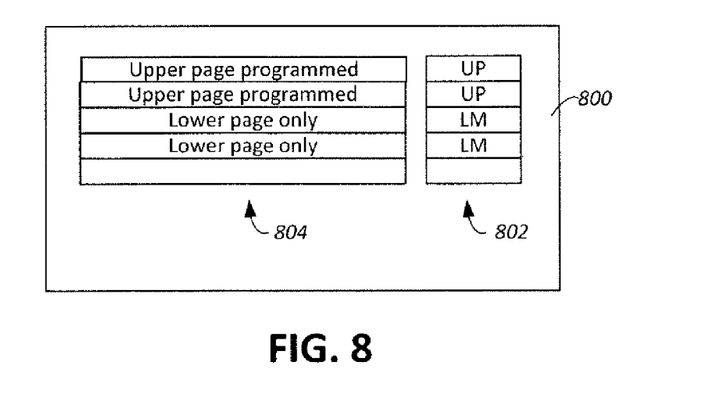
FIG. 8 shows an example of flags used to indicate whether logical pages are written or unwritten.

One way to indicate the programming level of a page is to maintain a flag (single bit, or multi-bit) or other indicator that reflects the current contents of the page. FIG. 8 shows an example of a memory 800 in which indicators 802 are maintained for each of a group of physical pages 804. Indicators 802 indicate whether the corresponding page is programmed with lower mode (LM) data or both lower and upper page (UP) data. Such an indicator allows the memory system to quickly check whether additional data can be stored in a particular physical page. In one arrangement, a flag consists of two or more bits that provide redundancy that is sufficient to ensure a high chance of correctly indicating the programming level. In some examples, two or more bytes provide a high degree of redundancy for storing such flags.

Figure 9:
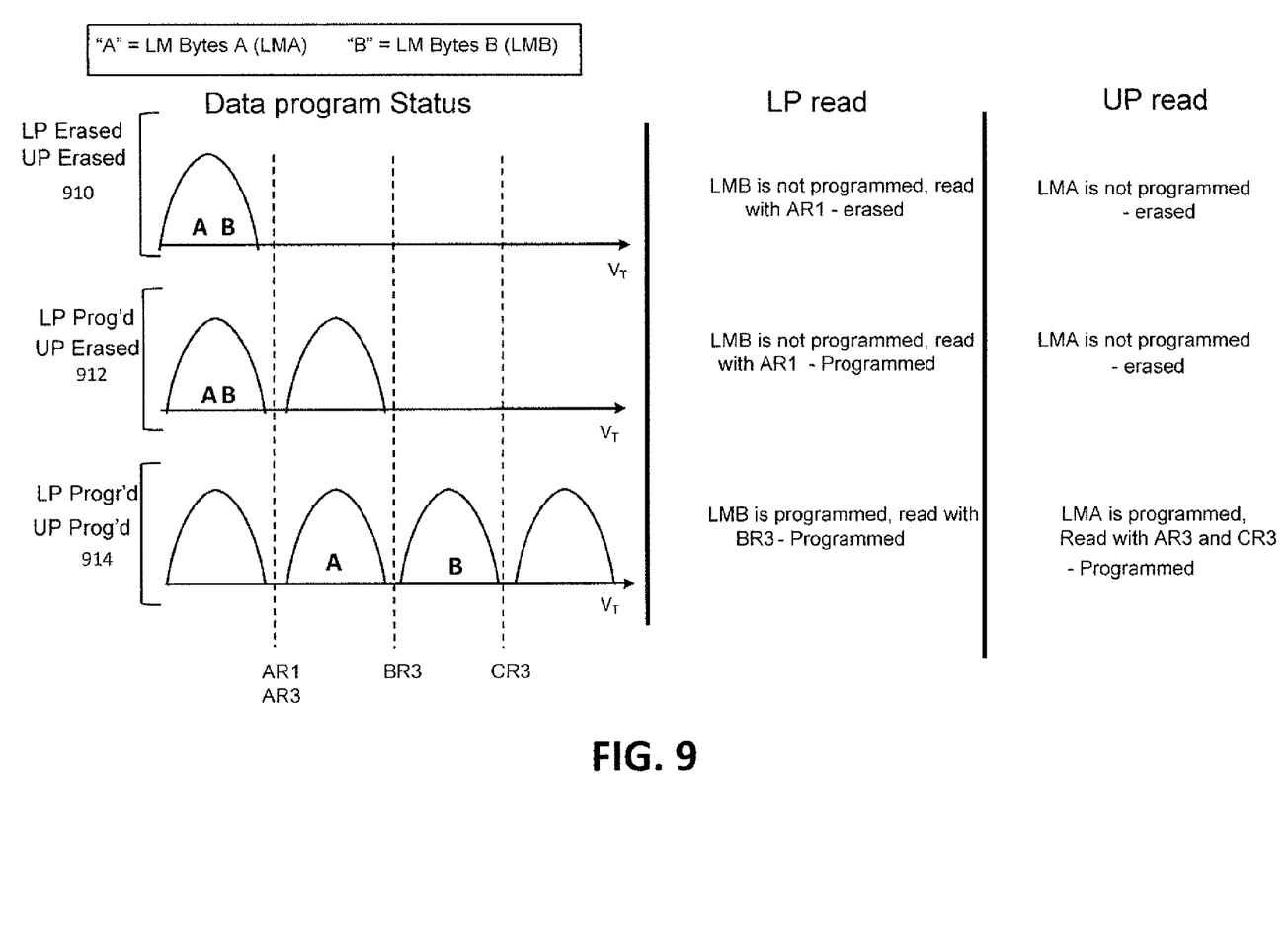
FIG. 9 shows how flags may be stored in MLC memory cells

FIG. 9 shows an example of how individual flag bits may be programmed to indicate corresponding programming levels of a physical page (i.e. indicate whether the physical page is completely erased, contains lower page data only, or contains upper and lower page data). In the example shown, flag bits are maintained in memory cells that are generally programmed in parallel with programming of data into the physical page and the cells may be considered part of the physical page even though they do not contain user data. Each level of FIG. 9 shows a different stage of programming. In the scheme shown in FIG. 9, two different flags are maintained. One flag, LMB, denoted by "B," is used to determine which read voltage to use for reading a lower page. The other flag, LMA, denoted by "A," is used to determine whether the upper page is programmed.

Initially, as shown in the top level 910 all LMA and LMB flag cells are in the "0" or erased state like all the cells of the page. Both the lower page and upper page are erased at this point. When the lower page is programmed, as shown on the middle level 912, the flag cells remain in the erased condition. If a lower page read is performed at this point, then because LMB indicates that the upper page is not programmed, the read voltage AR1 (which corresponds to $D_A$ of FIG. 7) is used. Because LMA indicates that the upper page is not programmed there are no read voltages indicated for an upper page read at this point.

When the upper page is subsequently programmed, as shown on the bottom level 914, LMB cells are programmed to the "2" state and LMA cells are programmed to the "1" state. If a lower page read is performed at this point, then the LMB flag is checked to determine which read voltage to use. Because the LMB flag indicates that the upper page is programmed, the voltage BR3 (corresponding to $D_B$ of FIG. 7) is used. Because LMA indicates that the upper page is programmed, the upper page may be read with AR3 and CR3 (corresponding to $D_A$ and $D_C$ of FIG. 7). While both AR1 and AR3 are shown as the same voltage in this example, in other examples, these voltages may be different.

Under certain conditions, flags may not provide correct information. For example, as the result of a write abort (a partially completed write operation) the cells containing the flag bits may not have reached their assigned levels. Even where cells containing flag bits were fully programmed to their assigned levels, they may become corrupted over time as a result of some data retention failure.

Figure 10:
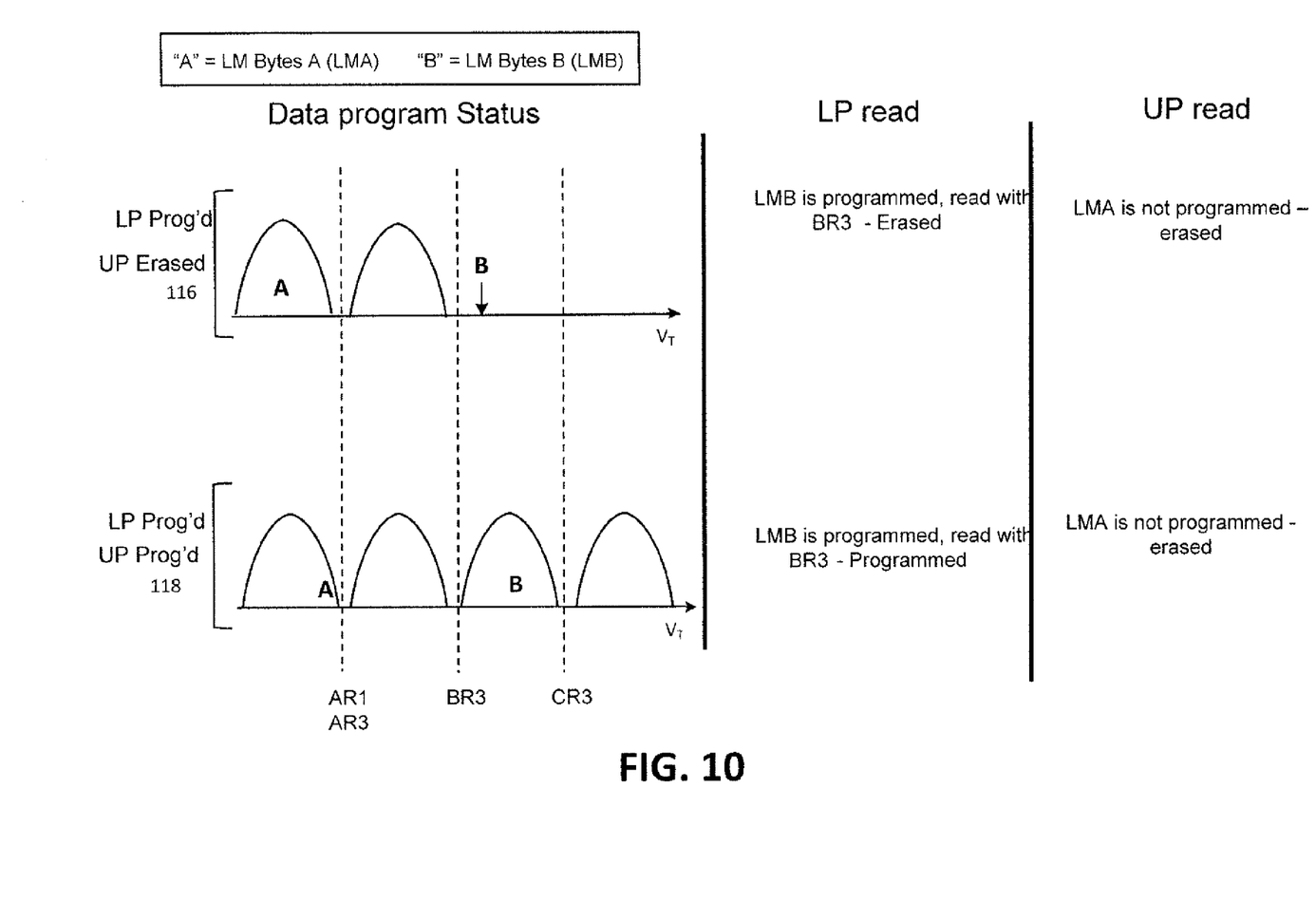
FIG. 10 shows how an error may occur when a flag is read.

FIG. 10 shows two examples of flags that do not reflect correct information. Where the lower page is programmed but the upper page is erased, the LMB flag cells may be read as being in the "2" state above BR3, as shown on the top level 116. This may be because of overprogramming, disturbance from other operations, or for some other reason. Thus the LMB flag appears to indicate that the upper page is programmed even though in reality it is erased. When the LMB flag is checked to determine which read voltage to use for the lower page, voltage BR3 is indicated because the upper page is apparently programmed. However, because the upper page is not really programmed, the data read out will not be correct data (data that was written) and it will appear that the lower page bits are all in the erased, "1" state. Thus, the lower page data is misread.

Where both lower page and upper page are programmed, as shown on the bottom level 118, the LMA flag may be read as being in the erased "1" state, below AR1. This may be due to incomplete programming (e.g. due to a write abort) or disturbance from other operations, or from some other cause. Thus, the LMA flag indicates that the upper page is not programmed (indicates that upper page is erased) when, in reality, it is programmed. Thus, the data in the upper page would not be read because the flag indicates that there is no data there. Furthermore, there is a danger that the memory could attempt to write additional data into the upper page, thereby corrupting both the data already stored in the upper page and the new data that the memory tries to store there.

In certain situations, concerns regarding the reliability of flags make it worthwhile to verify such flags using an erased page confirmation process. An erased page confirmation process verifies that a page that appears to be erased really is erased by performing additional checking.

Figure 11:
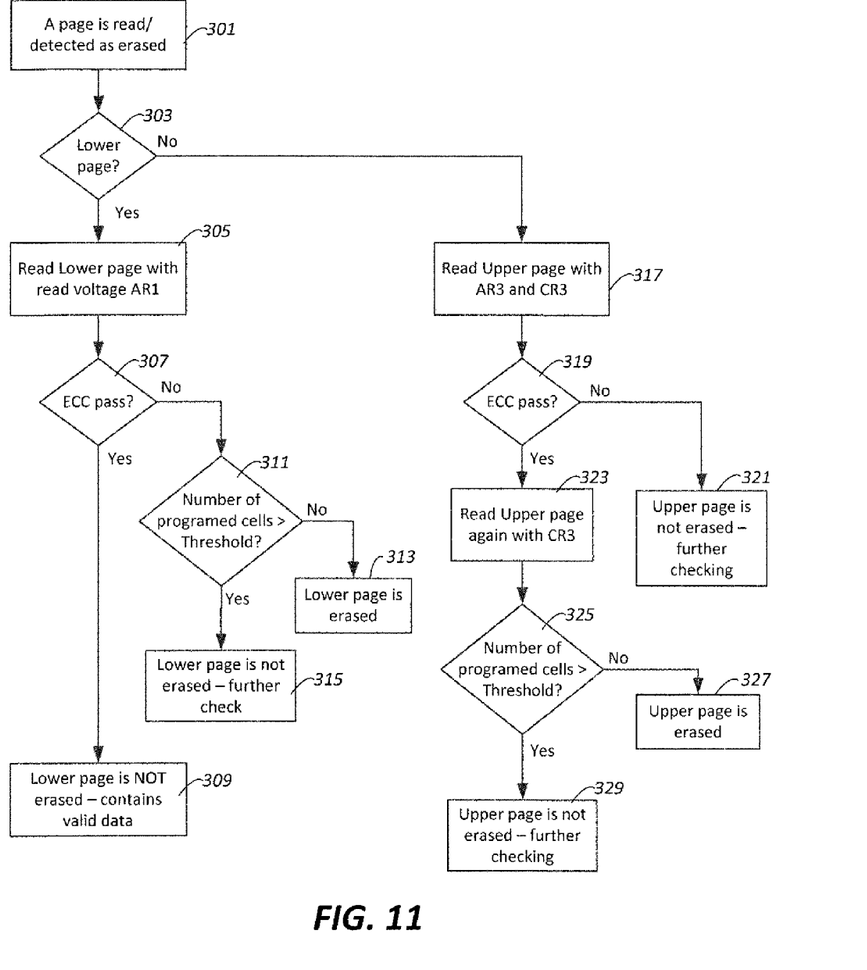
FIG. 11 is a flowchart showing a system for verifying that a logical page is unwritten.

FIG. 11 is a flowchart for an erased page confirmation process according to an aspect of the present invention. A logical page is initially read/detected as erased 301. Typically, this is achieved by performing an initial user mode read operation on the physical page (containing data and flags) using a predetermined read voltage such as AR1, which gives flag status for LMA and LMB. In other cases a different predetermined voltage will be used. Where the upper page is indicated to be erased, the data obtained by reading with voltage level AR1 corresponds to lower page data. Thus, this initial read may indicate the condition of both the upper and lower pages.

If the logical page of interest (logical page being verified as erased or unwritten) is a lower page 303 then a test mode read is performed using AR1 305. The results of the read using read voltage AR1 are checked using Error Correction Coding (ECC) 307. If the data thus read passes the ECC checking (i.e. contains no errors, or only ECC correctable errors), then the lower page is NOT erased and contains valid data 309. However, if the data fails ECC checking, then the number of programmed cells (cells turned on under read voltage AR1) is checked 311. If the number of programmed cells is less than the threshold number (number chosen to represent an upper limit for the number of error bits in an erased lower page), then this indicates that the page is erased 313 and that the cells that appear to be programmed represent an acceptable number of error bits. If the number of programmed cells is greater than the threshold number, then this indicates that the page is not erased 315 because the programmed cells represent more than acceptable errors in an erased page. This indicates that the page contains some programmed data which requires further checking. The lower page data may be recoverable using different read voltages. In any event, the lower page should not be used to store additional data in this condition.

If the logical page of interest (logical page being verified as erased) is an upper page, then a test mode upper page read is performed using AR3 and CR3 317. The data thus-read is checked by ECC 319. If the data does not pass ECC checking, then the upper page is not erased and requires further checking 321. In this condition, the upper page should not be used to store additional data. If the upper page data passes ECC checking, then yet another read is performed using CR3 323 and the results of this read are compared with a threshold number representing an upper limit of acceptable error bits in an erased upper page 325. If the number of programmed bits read using CR3 (number of bits in "3" state) is not greater than the threshold number, then the upper page is erased 327. However, if the number of programmed bits read using CR3 is greater than the threshold number then the upper page contains data and requires further checking 329.

Figure 12:
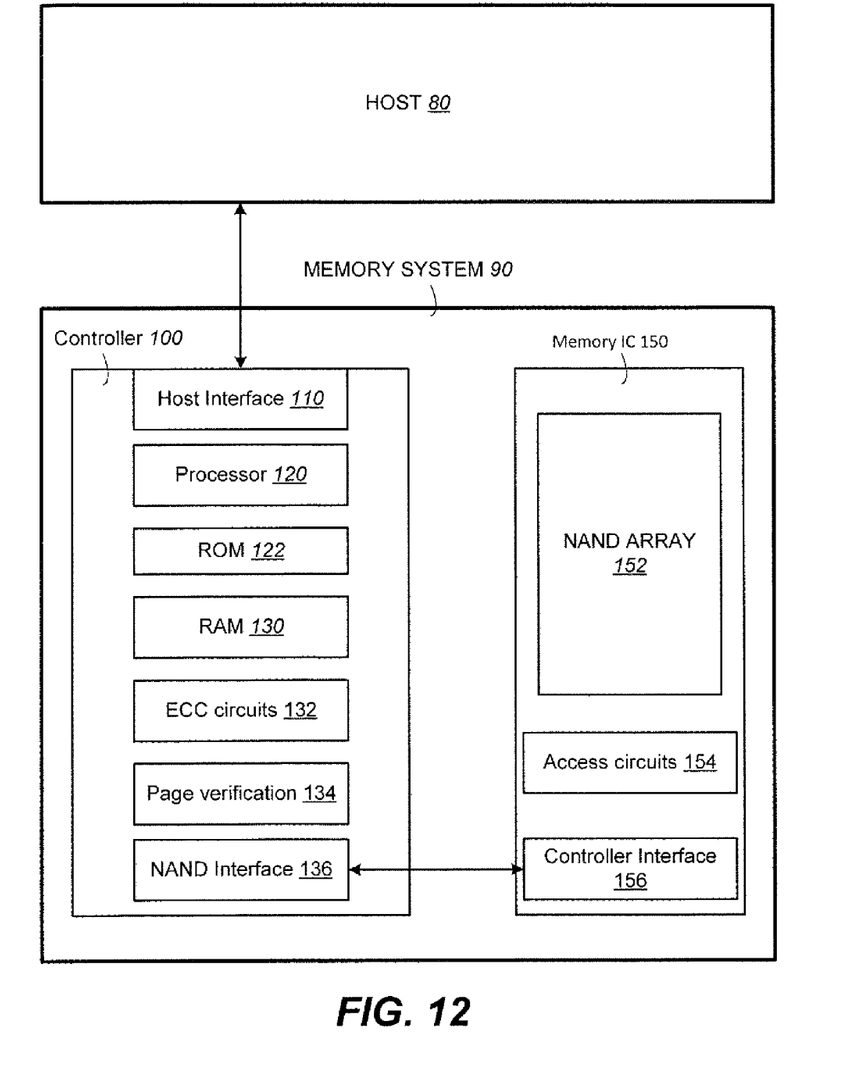
FIG. 12 shows an example of components of a memory system.

FIG. 12 shows an example of memory system hardware that may be used in some embodiments of the present invention. This is a more detailed view than shown in FIG. 1 and shows an example of how the structure of FIG. 1 may be implemented. The memory system 90 may receive power from the host 80 and may be connected to a host through a removable connector making it vulnerable to power loss in the case that it is unexpectedly disconnected from the host. Some of the circuits within the memory controller 100 and a NAND memory IC 150 are shown (although it will be understood that there are other circuits that are not shown). The memory controller 100 includes a host interface circuit 110, processor 120, Read Only Memory (ROM) 122, Random Access Memory (RAM) 130, ECC circuits 132, Page verification circuits 134, and a NAND interface 136. Page verification circuits 134 located in memory controller 100 as shown may execute a verification scheme as disclosed above, in conjunction with other circuits in the controller 100 and the memory IC 150. The memory IC includes the NAND array 152 and access circuits 154, which may include read, write, and erase circuits. A controller interface 156 is located in the memory IC 150. The controller interface 156 is in communication with a corresponding NAND interface 136 in the memory controller 100. Circuits such as access circuits, and controller interface circuits, and other circuits (e.g. logic circuits) on a memory IC may be referred to as peripheral circuits (often located around periphery of NAND array).

The page verification circuits 134 may be dedicated circuits formed in the memory controller 100 (which may be an Application Specific Integrated Circuit, or ASIC), or may be general purpose circuits that are configured through firmware for the specific purpose of page verification. In other embodiments, page verification circuits may be located elsewhere, for example, on a memory IC. ECC circuits may also be located on a memory IC in some cases so that erased page confirmation may be executed by the memory IC independently of the memory controller.

An erased page confirmation process such as described above may be applied to any logical page that appears to be erased in order to verify that it really is erased. In general, this will be done in particular cases where there is reason to doubt that a flag or flags represent the true state of the page. For example, if it is known that a write abort or other potentially corrupting event has occurred, where the flags are in a known bad block, or bad portion of the memory, after a power-on where it is not known whether a write abort occurred previously. An erased page confirmation may be performed to verify the condition of an upper page prior to reading a lower page so that the correct read voltage is used. An erased page confirmation process may be used prior to writing data in an apparently erased logical page, especially if the data being written is particularly important, or the area where it is to be written is particularly suspect.

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of verifying a program/erase condition of a logical page of a multilevel flash memory comprising:
   reading one or more flag bits that indicate the program/erase condition of the logical page;
   in response to determining that the one or more flag bits indicate that the logical page is erased, further verifying the erased condition of the logical page by:
   performing a read of the logical page;
   performing Error Correction Coding (ECC) analysis of data read from the logical page;
   subsequently identifying a number of cells that are not in a state corresponding to the logical page being erased; and
   comparing the number of cells that are not in a state corresponding to the logical page being erased with a predetermined number in order to verify the program/erase condition of the logical page.

2. The method of claim 1 wherein the logical page is an upper page and wherein the read of the logical page is performed using two read voltages.

3. The method of claim 2, further comprising, subsequent to performing the ECC analysis, performing a subsequent read.

4. The method of claim 3 wherein the number of cells that are not in a state corresponding to the logical page being erased is identified from the subsequent read.

5. The method of claim 4 wherein the subsequent read is performed using one of the two read voltages.

6. The method of claim 4 wherein the subsequent read is performed using a voltage that is different to both of the two read voltages.

7. The method of claim 1 wherein the ECC analysis of data read from the logical page indicates a pass result.

8. A method of verifying that a logical page in a multi-level cell (MLC) flash memory is unwritten comprising:
   in response to determining that a flag indicates that the logical page is unwritten, subsequently performing a read operation on the logical page to obtain verification data;
   subsequently performing Error Correction Code (ECC) analysis of the verification data;

if the verification data passes ECC analysis, then identifying the logical page as written;

if the verification data fails ECC analysis, then determining a number of bits in the logical page that are inconsistent with the logical page being unwritten;

comparing the number with a threshold;

if the number exceeds the threshold, then identifying the logical page as written; and if the number does not exceed the threshold then identifying the logical page as unwritten.

9. The method of claim 8 wherein the logical page is a lower page and the number of bits in the logical page that are inconsistent with the logical page being unwritten is obtained from the verification data.

10. The method of claim 8 wherein the number of bits in the logical page that are inconsistent with the logical page being unwritten is obtained from an additional read operation that is performed subsequent to performing the ECC analysis of the verification data.

11. The method of claim 10 wherein the logical page is an upper page and the additional read operation identifies memory cells in a memory state with the highest threshold voltage range.

12. The method of claim 8 wherein, when the logical page is identified as written, subsequent writing to the logical page is prohibited until after an erase is performed.

13. A multi-level cell (MLC) flash memory system comprising:
   an array of flash memory cells arranged in physical pages, each physical page having capacity to store two logical pages of data, a lower page and an upper page;
   a plurality of page status flags, each page status flag associated with a logical page;
   a read circuit configured to read data from the memory array;
   an Error Correction Code (ECC) circuit configured to encode data to be stored in the array of flash memory cells and decode data from the array of flash memory cells, the ECC circuit configured to identify errors in data from the array; and
   a page verification circuit configured to verify a page status flag that indicates that a logical page is unwritten by obtaining an indication from the ECC circuit that the logical page is unwritten, and subsequently determining a number of bits within the logical page that are not in an unwritten state, and verifying the logical page as unwritten only if the number is less than a threshold number.

14. The multi-level cell (MLC) flash memory system of claim 13 wherein the read circuit applies a set of read conditions to determining the number of bits within the logical page that are not in an unwritten state.

15. The multi-level cell (MLC) flash memory system of claim 14 wherein the set of read conditions include a discrimination voltage to discriminate between written and unwritten cells.

* * * * *